United States Patent
Koker et al.

(10) Patent No.: US 7,829,054 B2
(45) Date of Patent: Nov. 9, 2010

(54) ACTUATOR ON THE BASIS OF GEOMETRICALLY ANISOTROPIC NANOPARTICLES

(75) Inventors: Torsten Koker, Mannheim (DE); Ulrich Gengenbach, Remchingen (DE)

(73) Assignee: Forschungszentrum Karlsruhe GmbH, Karlsruhe (DE)

( * ) Notice: Subject to any disclaimer, the term of this patent is extended or adjusted under 35 U.S.C. 154(b) by 799 days.

(21) Appl. No.: 11/475,423

(22) Filed: Jun. 27, 2006

(65) Prior Publication Data

US 2010/0237744 A1   Sep. 23, 2010

(30) Foreign Application Priority Data

May 25, 2004   (DE) .................. 10 2004 025 603

(51) Int. Cl.
*D01F 9/12* (2006.01)
*H01J 1/00* (2006.01)
*H01J 21/22* (2006.01)
(52) U.S. Cl. ............ 423/447.1; 423/447.2; 313/151; 313/152; 977/953; 977/954; 977/955; 977/956; 977/957
(58) Field of Classification Search .............. None
See application file for complete search history.

(56) References Cited

U.S. PATENT DOCUMENTS 4,812,698 A * 3/1989 Chida et al. .............. 310/330
6,682,677 B2 * 1/2004 Lobovsky et al. ......... 264/172.11
6,764,628 B2 * 7/2004 Lobovsky et al. ......... 264/172.15
2004/0232807 A1 * 11/2004 Pelrine et al. .............. 310/800

FOREIGN PATENT DOCUMENTS

DE     101 26 606     12/2002
DE     102 44 312     4/2004

OTHER PUBLICATIONS

Haque et al. Carbon-Nanotube-Sheet-Actuator—Theoretical and Experimental Investigations; SPIE Conference Smart Structures and Materials; 5385, 249; Mar. 15, 2004.*
Baughman et al.; Science; vol. 284, pp. 1340-1344; May 21, 1999.*
Haque et al.; "Carbon-nanotube-sheet actuator-theoretical and experimental investigations", Proceedings of the SPIE—the International Society for Optical Engineering, USA vol. 5385, No. 1, Mar. 2004, pp. 249-259.
Baughman et al. "Carbon Nanotube Actuators", American Association for the Advancement of Science, vol. 284, No. 21, May 1999, pp. 1340-1344.
Frayesse et al.; "Carbon nanotubes acting like actuators", vol. 40, No. 10, Aug. 2002, pp. 1735-1739.

* cited by examiner

*Primary Examiner*—Melvin C Mayes
*Assistant Examiner*—Guinever S Gregorio
(74) *Attorney, Agent, or Firm*—Klaus J. Bach

(57) ABSTRACT

In an actuator including at least one active electrode disposed in an electrolyte and comprising at least two webs of an electrically conductive material with a plurality of geometrically anisotropic nanoparticles disposed thereon and oriented uni-directionally in a preferential direction with an electrically conductive connection between the nanoparticles and the webs and a potential difference with respect to ground can be applied to the active electrode by a voltage or current source, the nanoparticles are connected in each case to two webs and the connections are material-interlocking.

12 Claims, 2 Drawing Sheets

Section A–A

ACTUATOR ON THE BASIS OF GEOMETRICALLY ANISOTROPIC NANOPARTICLES

This is a continuation-in-part application of international patent application PCT/EP2005/004053 filed Apr. 16, 2005 and claiming the priority of German application 10 2004 025 603.9 filed May 25, 2004

The present application resides in an actuator, particularly a translation or bending actuator, on the basis of electrically and mechanically contacted geometrically anisotropic nanoparticles, particularly small tubes or fibers with diameters in the nano meter area, for example carbon nano-tubes.

Actuators serve the direct conversion of electrical energy into a mechanical positioning movement and, as a result, form essential components for many technical systems, particularly in robotics or in switching devices.

Actuators of the type mentioned above are based on so-called electro-mechanical actuation materials. In such materials, a change of the shape or of the mechanical properties is in direct interaction with an applied electrical current or an electrical field or an electrical voltage. Typical representatives of such actuators are based on piezo-electric or electrostrictive materials.

A new and particularly interesting concept is represented by actuator with nanotubes. In those actuators, small tubes (hollow cylinders) with diameters in the nano-area consisting of carbon (carbon nanotubes=CNT's) are utilized in electrolytes as active elements for the generation of an actuator movement. CNTs are thermally and chemically extraordinarily stable. The length of CNTs is about 100 μm to far above 100 μm. If, via a voltage or current source, charges are applied to the CNTs, an electrochemical double layer is formed with the electrolyte ions. By this double layer, the length of the co-valent bonds between the carbon atoms and, as a result, the length and the diameter of the CNTs are changed.

The specific electric resistance of metallic and semiconductive CNTs (depending on the orientation of the hexagonal structure of the graphite lattice relative to the tube axis=helicity) differ significantly from each other. Metallic CNTs have, with ideal observation, practically no specific electrical resistance, since the electrons are conducted in the nanotube almost ballistically, that is, without stray losses. However, if such a CNT is contacted by metal contacts, a transits resistance in the kΩ range develops at each contact point. In semicon-conductive CNTs, the specific resistance depends on the voltage applied, the resistance in the range of about −0.5 V to 0.5 V being several MΩ depending on the contacting. The current/voltage characteristic line is nonlinear in the range of about −1V to 1V. By the application of a gate voltage via a third electrode to a semi-conductive CNT, like in a field effect transistor, this non-linearity of the characteristic line can be suppressed and the specific resistance can be reduced.

The tensile strength of CNTs is in the area of 30,000 N/m² (for comparison: high-strength steel: about 1900 n/mm², high strength carbon fibers: about 4900 N/mm²), wherein the elongation obtained at break (in the tension test) is more than 5%.

Basically, two types of CNTs are present, that is, single-walled carbon nanotubes, SWCNTs, and multi-walled carbon nano-tubes, MWCNTs.

Single-walled CNTs (SWCNTs), described in [1] to [3] are seamless, hollow cylinders which consist of a graphite layer wound around the tube axis. Depending on the orientation of the hexagonal structure of the graphite lattice with respect to the tube axis (helicity), they are metallically conductive or semi-conductive. SWCNTs arrange themselves preferably in tube clusters with a preference orientation, wherein the individual SWCNTs are held together by van der Waals forces. A reliable statement concerning electrical properties of SWCNT clusters is not possible at this time since the individual SWCNTs have no uniform helicities and therefore different electrical properties. The electrical properties of CNT clusters also depend on which SWCNTs (metallic or semiconductive) of a tube cluster are electrically contacted. The diameters of SWCNTs are in the area of 0.4 to 5 nm.

Multi-wall CNTs (MWCNTs, mentioned for example in [3], on the other hand, consist of several single wall CNTs of different diameters which are disposed coaxially within one another. Also here, a statement concerning the electrical properties is problematic since the individual SWCNTs of a MWCNT have basically different helicities and consequently different electrical properties. Furthermore, the electrolyte has unrestricted access practically only to the outer CNT. Like in connection with SWCNT-clusters, it is also here important which CNTs (metallic or semi-conductive) of a MWCNT are electrically contacted. Common outer diameters of MWCNTs are in the range of 1.4 to 200 nm.

The E-modulus of individual SWCNTs (metallic and semi-conductive) is about 1,000,000 N/nm² (for comparison: steel about 210,000 N/mm². It is generally larger than that of SWCNT clusters, since the individual CNTs are held together in a cluster only via van-der-Waals forces. The E-modulus of MWCNTs on the other hand is influenced by force introduction into the MWCNT and maximally reaches the values of individual SWCNTs. If, ideally, the force is introduced and conducted out via the same tube of a SWCNT, the E-modulus is comparable with that of a SWCNT. If the force is conducted into and out via different SWCNTs, a telescope-like system is formed whose E-modulus cannot reasonably be determined.

Because of these properties CNTs are of interest for actuators, particularly for applications in microsystems medical- or nanotechnologies and also for biomedical applications (for example, artificial muscles). Such actuators have particularly the following interesting properties:

large reversible stretch area of the active elements of the electrically controlled unstressed actuator (up to about 1.6%) already with a low electrical voltage (about 1 V) and small control currents, that is, a high efficiency
a high dynamic
linear connection between input and output values
high modulus of elasticity of the active elements, high actuator forces can be achieved as a result;
operative in solid and liquid electrolytes,
can be integrated in materials (Smart Materials)
can be scaled by way of suitable construction and joining techniques
long life,
Applications also at high temperatures (up to about 1000° C.,
High volumetric and gravimetric operating capacities.

The publication [4] describes for example a corresponding actuator concept wherein a plurality of CNTs are combined, that is bundled to macroscopic layer, the so-called "Bucky-Paper" layer forming an active electrode of the actuator. Herein the CNTs have a clearly defined preferential direction. On this basis, translatory and bending actuators are proposed.

In the publication [3], furthermore, for the introduction of a preferential direction of CNTs for the alignment of the nano-tubes, known physical a chemical methods are proposed, for example, by electrical magnetic and/or electromagnetic fields and/or under the influence of ultrasound in a sedimenting tenside suspension.

Such actuators have, with the bucky-paper used, a resiliency which is extremely high in comparison with the individual CNTs (higher by about a factor 2200). Such an actor cannot be highly stressed mechanically. Consequently, also a strong dependency of the actuator expansion on the forces effective on the actuator can be expected and, in principle, also a non-linear correlation between tension and expansion and the occurrence of hysteresis of the expansion behavior. Furthermore, the access of the electrolyte ions to the CNTs in the interior of the Bucky paper in comparison with the outer CNTs is first delayed which, in connection with the low electrical conductivity of Bucky-paper, limits the maximally possible deflection frequencies of the actuators and also results in a higher heat loss and a lower actuator expansion. In addition, restructuring and settling processes in the relative loose Bucky paper structure and consequently, an increase in cycle-dependent degradation effects of the actuators can be expected.

It is therefore the object of the invention to provide an improved actuator concept on the basis of the geometrically anisotropic nanoparticles, particularly nanotubes such as CNTs. In particular, the actuator is to be improved with regard to higher actuator forces, loading capability, rigidity, expansion, and deflection frequencies.

SUMMARY OF THE INVENTION

In an actuator including at least one active electrode disposed in an electrolyte and comprising at least two webs of an electrically conductive material with a plurality of geometrically anisotropic nanoparticles disposed thereon and oriented uni-directionally in a preferential direction with an electrically conductive connection between the nanoparticles and the webs and a potential difference with respect to ground can be applied to the active electrode by a voltage or current source, the nanoparticles are connected in each case to two webs and the connections are material-interlocking.

The essential basic concept of the invention resides in orienting ideally all, but preferably at least 80%, or better 90%, of the nanoparticles or tubes, particularly CNTs, in the actuator in a preferred direction, preferably parallel to one another, with a maximum angle deviation of ±20° in particle rows or particle bundles and to firmly interconnect them electrically and mechanically by way of webs which extend preferably normal to the preferred direction (actuator layer). In the tension and respectively compression direction, furthermore, several such actuator layers may be arranged in series, one after the other.

As nanoparticles, basically all materials are suitable on whose surface a double layer is formed in an electrolyte. Such a double layer causes a change of the lattice spacing and as a result a change in the shape of the nanoparticles. An influence can be observed basically in all types of connections. The special advantage of CNTs or other nanotubes resides in the maximally possible ratio of surface (with double layer) to volume and consequently, in an optimal utilization of the effect mentioned earlier.

A further essential detail feature of the invention resides in the material interconnection of the nanoparticles and the webs. The interconnection is formed from a reaction product of the web-side and particle-side materials wherein those materials as well as the reaction product are electrically conductive. Furthermore, each of the nanoparticles is connected to at least two webs whereby the actuator rigidity can be significantly increased.

For the manufacture of the active electrode, for example, a number of webs are applied to a substrate and subjected to a flow of a dispersion including nanoparticles. With the application of a high-frequency alternating voltage between the webs the nanoparticles are deposited on the webs by dielectrophoretic forces according to the electric field lines in the desired way in parallel relationship, such that they bridge the spaces between the webs. In further steps, the excess dispersion is removed and the nanoparticles and the webs are electrically interconnected by way of a reaction as mentioned earlier.

Several actuator layers disposed on top of one another and consisting of webs and nanoparticles can be realized in various ways, for example, by a simple superimposition of several layers or by rolling up or folding up a layer. Also, multiple depositions of nanoparticles and webs at the desired contact locations and by the initiation of the reaction mentioned earlier (for example, annealing of the electrode at about 900° C.) results in the layer interconnection mentioned.

In a connection of CNTs (or carbon fibers) with webs, which is exemplary and does not limit the concept of the invention, the webs consist of a conductor material forming a carbide, preferably a metal, wherein the conductor material as well as the carbide are not electric insulators. Preferably, the webs consist of a transition metal such as titanium or of silicon. Alternatively, the webs are coated with the materials mentioned. At temperatures of about 900° C., a metal carbide is formed at the contact locations between the CNTs and the web by a solid body reaction whereby the CNTs and the webs are joined so that the joints can be mechanically stressed and are electrically conductive. An actuator which is produced in this way and pre-stressed by elastic elements is suitable not only as compression actuator but advantageously also as tensile actuator wherein an elastic pretension for reducing the chances of buckling is no longer necessary. For further improved contact, the contact locations may, after the deposition of the CNTs mentioned above, be coated with additional metal of the type referred to above, whereby, after the solid body reaction, the ends of the CNTs are totally embedded in metal carbide, so that also here an almost negligible electrical transition resistance between the CNT and the web is obtained.

The jointure of nano-particles and webs forms the active electrode of the actuator. Like, if applicable, a counter electrode, they are disposed in a liquid or solid electrolyte (salt solution or another solution mentioned in [1] to [4] and are connected to the poles of a voltage or current source. By electrically energizing the webs, the nanoparticles are electrically charged. An electrical field is generated in the electrolyte which is effective electrostatically on the electrolyte ions and binds them to the nanoparticles, whereby an electrochemical double layer is formed which leads to a significant change in length of the nanoparticles.

Since the nanoparticles are mechanically connected to the webs, also the distance between the webs changes with the change in length of the particles which results in an actuator movement (expansion or contraction), which is noticeable at the outer ends of the actuator. The webs can continue to be fixed with respect to the base body by elements of low rigidity and/or pretensioned by elastic elements.

The number of the actuator layers arranged on top of one another in the direction normal to the tension or compression direction influences the rigidity of the actuator in the way described earlier. The complete or almost complete orientation of the nanoparticles mentioned and the firm material connection to the webs result advantageously not only in a particularly high rigidity of the actuator, but offers also a substantially improved calculation basis for a reliable determination of the actuator properties since only a small fraction of the nanoparticles is in a jumbled array. Rigidity, maximum force and operating distance of the actuator are determined by the number and the thickness of the layers of CNTs and the webs.

The particular advantages of the invention are summarized as follows:
- increased expansion capability with equal actuator dimension or equal expansion capability with smaller actuator dimensions,
- particularly high actuator forces and loading capacity
- particularly high operating frequencies and speeds
- particularly low long-term degradation
- particularly high actuator rigidity and, consequently, low dependency of the expansion on the forces effective on the actuator
- linear and compatible relationship between the actuator input (electrical voltage or current), and the actuator output (expansion, bending or, respectively, force or bending torque)
- more efficient use of materials
- higher efficiency.

Below, the invention will be explained in greater detail on the basis of the accompanying drawings.

DESCRIPTION OF A PARTICULAR EMBODIMENT

Figure 1A:
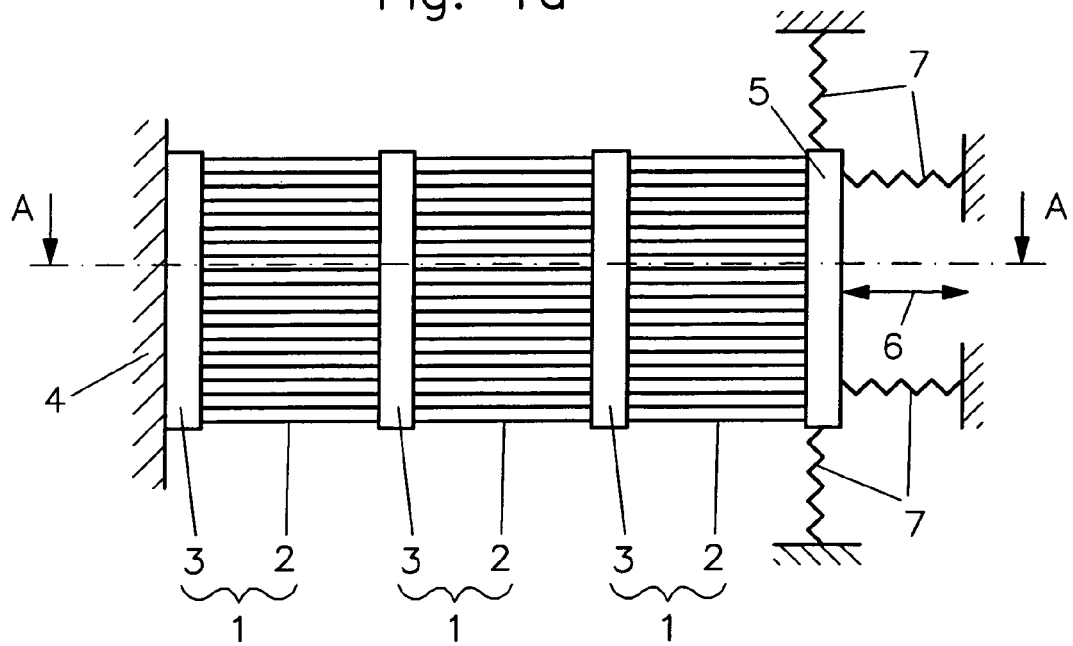
FIGS. 1a and 1b show the active electrode of the actuator in two views.
Figure 1B:
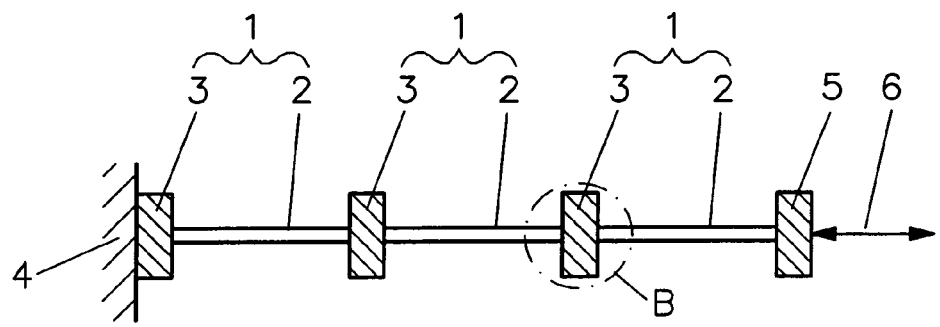

The core part of the invention, that is, the active electrode, is shown in FIGS. 1a and 1b wherein FIG. 1b is a cross-sectional view of the active electrode taken along line A-A of FIG. 1a. The active electrode consists of several actuator layers 1 comprising a plurality of CNTs 2 arranged parallel to one another and webs 3 arranged orthogonally to the CNTs. In the embodiment shown, the active electrode is connected with one end by means of a web to a solid support structure 4 and, with its free end, which is preferably also formed by a web in the form of an end member 5, executes the actuator actuation 6. Furthermore, FIG. 1 shows the elastic elements 7 for pretensioning a compression actuator and for guiding the webs 3.

The CNTs are arranged in the active electrode of the shown embodiment not in clusters but preferably in a plane parallel to one another (see FIG. 1b). In this way, uninhibited access of ions of the electrolyte is ensured, which substantially reduces possible delays and irregularities of an actuation.

Figure 2:
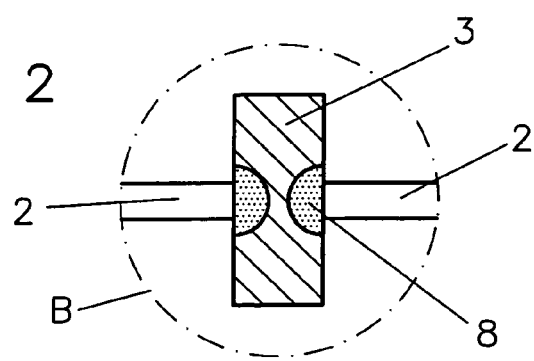
FIG. 2 shows a detail of the connection between the CNT and the web.

FIG. 2 shows a schematic detail enlargement of a transition area between CNTs and a web represented in FIG. 1b by the circle B. In the transition area, a CNT 2 abuts the web 3 of a conductor metal which is converted at the contact point to a carbide area 8 in a chemically and locally limited area. The carbide area serves to provide a material and, consequently, stable mechanical and electrical connection between the CNTs and the webs.

Figure 3:
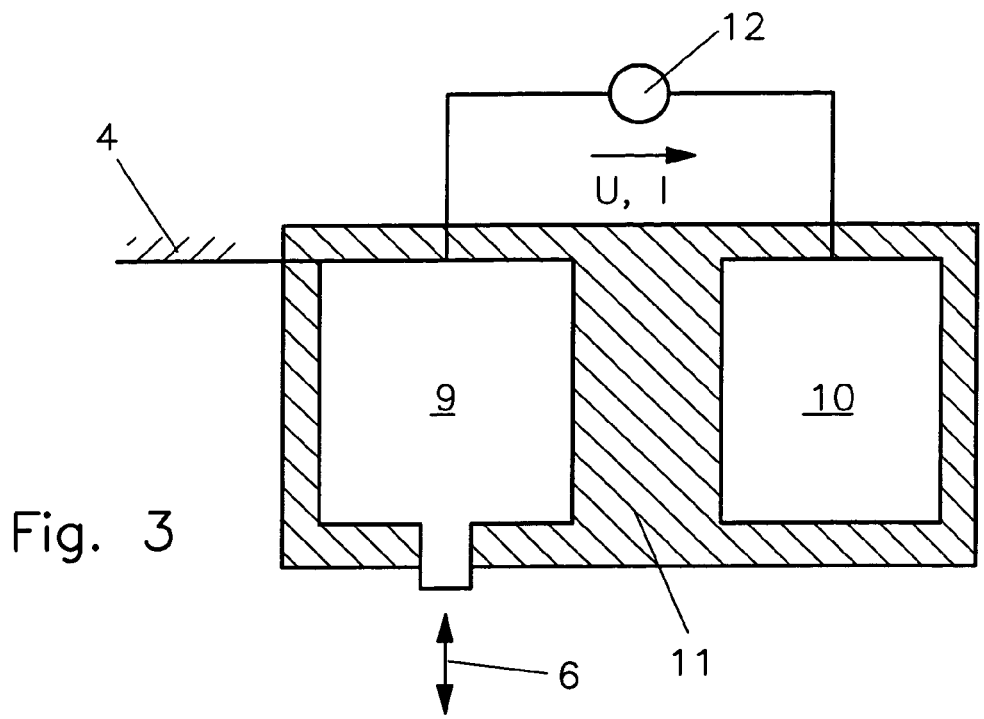
FIG. 3 shows the design, in principle, of a translation actuator.

FIG. 3 shows in a basic representation, the design of a translation actuator preferably for linear actuations 6. Herein, the active electrode 9 as well as the counter electrode 10 (passive electrically conductive electrode) of the actuator are disposed in a common electrolyte 11 and are electrically charged preferably oppositely by a voltage or current source 12 to a potential difference.

Figure 4:
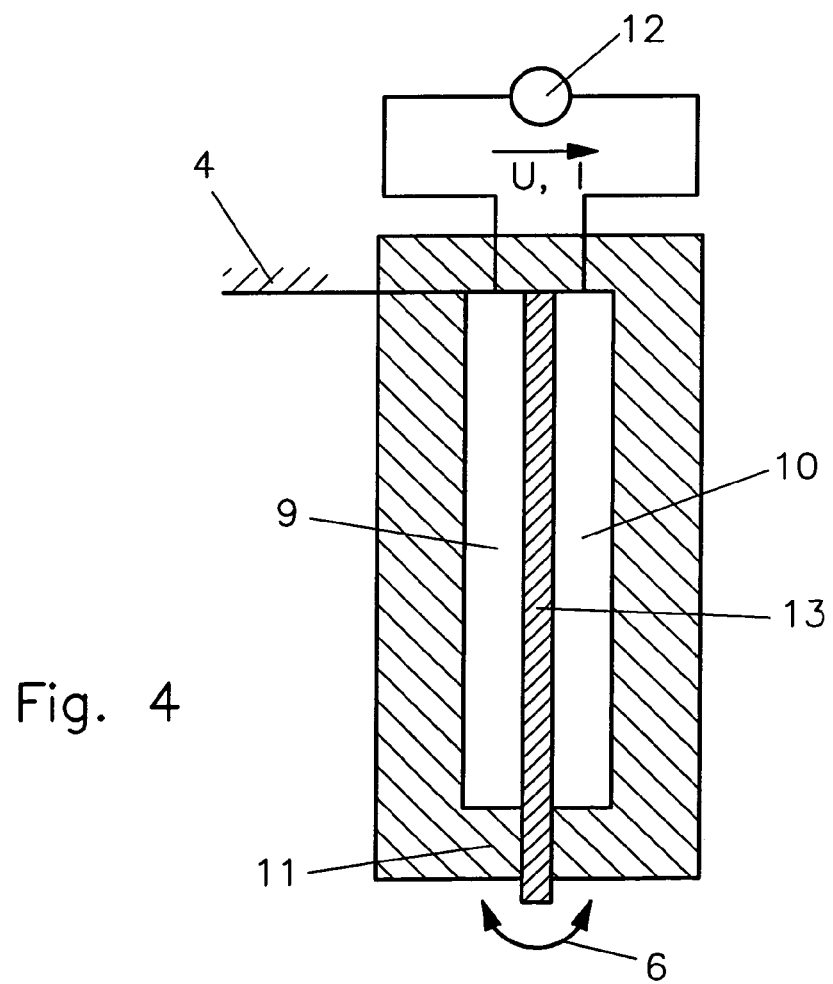
FIG. 4 shows the design, in principle, of a bending actuator.

FIG. 4 on the other hand shows in principle, the design of a bending actuator preferably for pivot movements. Also, in this case, the active electrode 9, as well as the counter electrode 10, is disposed in the electrolyte 11. In contrast to the actuator shown in FIG. 3 however, also the counter electrode is formed by a interconnection of CNTs and webs in the manner described above. A voltage- or current source 12 is provided for electrically preferably oppositely charging the electrodes with a potential difference. Small electrical charges result in opposite shape changes in the two electrodes. If, as shown in FIG. 4, the two electrodes are coupled mechanically by way of an electrically insulating connecting element 13, the actuator executes a bending motion forming an actuation 6 comparable with a bi-metal strip. Also, in this actuator concept, the rigidity and the maximum force and expansion can be influenced by the measures described above.

For the realization of actuators, particular of the kind described herein, basically all types of CNTs may be used, that is, individual metallic SWCNTs, individual semi-conductive SWCNTs, a mixture of individual metallic and individual semi-conductive SWCNTs, SWCNT clusters as well as MWCNTs and mixtures of SWCNTs and MWCNTs. Important however is a synchronous (microscopic) or quasi-synchronous (macroscopic) expansion behavior during the introduction of charges into the CNTs. The CNT-types mentioned differ from each other as pointed out initially particularly in the specific electrical resistance and in the E-modulus. With respect to the E-modulus the utilization of individual SWCNTs or of correctly contacted MWCNTs is reasonable for an actuator of high rigidity and large force and expansion capabilities.

Since it is necessary for the utilization of the electro-mechanical properties of CNTs to be electrically charged and since a linear connection between the input value (current voltage) and the output value (extension/bending or, respectively, force/bending moment) without additional expenditures is desirable, with this point in mind, the use of metallic SWCNTs for the actuator is preferable. With respect to E-modulus and a specific electric resistance, individual metallic SWCNTs are particularly suitable for the realization of an actuator with the properties as described above, which, however, does not exclude the use of the other CNT types mentioned.

As electrolytes all ion carriers, but particularly aqueous salt solutions with alkali metal ions and halogenide ions (for example, salt solutions), solid body electrolytes, diluted sulfuric acid or aqueous KOH solutions are to be considered.

What is claimed is:

1. An actuator including at least one active electrode (9) disposed in an electrolyte (11) and comprising at least two webs (3) of an electrically conductive material arranged in spaced relationship along a longitudinal axis with a plurality of geometrically anisotropic nanoparticles (2) disposed thereon and oriented uni-directionally in the direction of the longitudinal axis, with an electrically conductive connection between the nanoparticles and the webs (3) wherein the axial ends of the nanoparticles are electrically connected orthogonal to the webs via electrically conductive or semiconducting material-interlocking connections and a potential difference with respect to ground being applicable to the active electrode (9) by a voltage or current source (12), the nanoparticles (2) being connected in each case to two webs and the connections being material-interlocking, said nanoparticles (2) consisting of carbon, the webs (3) consisting of a carbide-forming conductor material or being coated by the conductor material, and the connection consisting mainly of a carbide of the conductor material, the conductor material as well as the carbide being an electrical conductor or semiconductor.

2. An actuator according to claim 1, comprising at least one counter electrode (10) as ground in the electrolyte (11).

3. An actuator according to claim 1, wherein the nanoparticles comprise mainly nanotubes and at least 80% of all nanotubes are oriented in the preferential direction with a deviation of maximally +20°.

4. An actuator according to claim 1, wherein the conductor material contains one of titanium and silicon.

5. An actuator according to claim 1, wherein the nanoparticles (2) are single-walled or multi-wall nanotubes.

6. An actuator according to claim 1, wherein the webs of an electrode are electrically short-circuited with one another.

7. An actuator according to claim 1, wherein the nanoparticles (2) form between two webs (3) in each case a bundle or a particle row which form with a web in each case an actuator layer (1) and the active electrode (9) comprises at least two actuator layers which are mechanically connected in series in the preferential direction.

8. An actuator according to claim 1 for translational actuation, wherein one end of the active electrode (9) is connected to a rigid support (4) by way of a web (3) and, starting at the rigid support, the preferential direction determines the actuation direction (6).

9. An actuator according to claim 1 for bending movements, wherein the active electrode is arranged parallel to a low-stretch element and is mechanically coupled therewith.

10. An actuator according to claim 9, wherein the low-stretch element is a counter electrode and the active electrode and the counter electrode are arranged at opposite sides of an electrically insulating connecting element (13) and are mechanically coupled together.

11. An actuator according to claim 10, wherein the counter electrode is formed in accordance with the active electrode (9).

12. An actuator according to claim 10, wherein the electrode (9), the counter electrode (10) and the connecting element (13) are connected at one end to a rigid support (4) in such a way that the actuating movement comprises a pivot movement of the other end.

* * * * *